(12) United States Patent
Ballesteros et al.

(10) Patent No.: US 11,424,131 B2
(45) Date of Patent: *Aug. 23, 2022

(54) POLISHING COMPOSITIONS AND METHODS OF USING SAME

(71) Applicant: Fujifilm Electronic Materials U.S.A., Inc., N. Kingstown, RI (US)

(72) Inventors: Carl Ballesteros, San Tan Valley, AZ (US); Abhudaya Mishra, Gilbert, AZ (US); Eric Turner, Phoenix, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/929,265

(22) Filed: Jul. 15, 2020

(65) Prior Publication Data

US 2020/0343098 A1    Oct. 29, 2020

Related U.S. Application Data

(63) Continuation of application No. 16/356,685, filed on Mar. 18, 2019, now Pat. No. 10,763,119.

(60) Provisional application No. 62/781,648, filed on Dec. 19, 2018.

(51) Int. Cl.
C09G 1/02 (2006.01)
H01L 21/3105 (2006.01)

(52) U.S. Cl.
CPC .......... H01L 21/31053 (2013.01); C09G 1/02 (2013.01)

(58) Field of Classification Search
None
See application file for complete search history.

(56) References Cited

U.S. PATENT DOCUMENTS

| 6,042,741 | A | 3/2000 | Hosali et al. |
| 6,455,417 | B1 | 9/2002 | Bao et al. |
| 9,125,831 | B2 | 9/2015 | Weser et al. |
| 9,486,892 | B2 | 11/2016 | Onishi et al. |
| 9,752,057 | B2 | 9/2017 | Hou et al. |
| 10,066,126 | B2 | 9/2018 | Dockery et al. |

(Continued)

FOREIGN PATENT DOCUMENTS

| CN | 1660923 | 8/2005 | ............... C08J 5/14 |
| CN | 1742066 | 3/2006 | ............... C09G 1/02 |

(Continued)

OTHER PUBLICATIONS

First Office Action issued by the Chinese Patent Office for Chinese Application No. 201910812821.8, dated Mar. 9, 2021 (with English Translation).

(Continued)

*Primary Examiner* — Roberts P Culbert
(74) *Attorney, Agent, or Firm* — Fish & Richardson P.C.

(57) ABSTRACT

This disclosure relates to a polishing composition that includes at least one abrasive; at least one nitride removal rate reducing agent, an acid and a base; and water. The at least one nitride removal rate reduce agent can include a hydrophobic portion and a hydrophilic portion; in which the hydrophobic portion includes a $C_{16}$ to $C_{22}$ hydrocarbon group and the hydrophilic portion comprises at least one group selected from the group consisting of a sulfinite group, a sulfate group, a sulfonate group, a carboxylate group, a phosphate group, and a phosphonate group. The polishing composition has a pH of about 2 to about 6.5.

24 Claims, 4 Drawing Sheets

(56) References Cited

U.S. PATENT DOCUMENTS

| | | |
|---|---|---|
| 10,119,048 B1 | 11/2018 | Guo et al. |
| 2004/0025742 A1 | 2/2004 | Kitayama et al. |
| 2005/0189322 A1 | 9/2005 | Lane et al. |
| 2005/0208761 A1 | 9/2005 | Oh et al. |
| 2006/0068589 A1 | 3/2006 | Bian |
| 2007/0128872 A1 | 6/2007 | Itoh et al. |
| 2009/0029633 A1 | 1/2009 | Carter et al. |
| 2009/0194504 A1 | 8/2009 | Sato et al. |
| 2011/0008967 A1 | 1/2011 | Kim et al. |
| 2011/0230048 A1 | 9/2011 | Guo et al. |
| 2012/0058642 A1 | 3/2012 | White et al. |
| 2013/0161285 A1 | 6/2013 | Li et al. |
| 2015/0221521 A1 | 8/2015 | Hou et al. |
| 2016/0107289 A1 | 4/2016 | Cavanaugh et al. |
| 2017/0029664 A1 | 2/2017 | Park et al. |
| 2017/0107404 A1 | 4/2017 | Kim et al. |
| 2018/0043497 A1 | 2/2018 | Hanano et al. |
| 2018/0057710 A1 | 3/2018 | Yasui |
| 2019/0071588 A1 | 3/2019 | Tada |
| 2020/0071566 A1 | 3/2020 | Park et al. |
| 2020/0199409 A1 | 6/2020 | Turner et al. |
| 2020/0203172 A1 | 6/2020 | Ballesteros et al. |

FOREIGN PATENT DOCUMENTS

| | | | |
|---|---|---|---|
| CN | 1784781 | 6/2006 | ............ H01L 21/76 |
| CN | 1837319 | 9/2006 | ............ C09K 3/14 |
| CN | 101443890 | 5/2009 | ......... H01L 21/304 |
| CN | 101959983 | 1/2011 | ............ C09G 1/02 |
| CN | 102199399 | 9/2011 | ............ C09G 1/02 |
| CN | 102559058 | 7/2012 | ............ C09G 1/02 |
| CN | 103097486 A | 5/2013 | ............ C09K 3/14 |
| CN | 103189457 | 7/2013 | ............ C09G 1/02 |
| CN | 103834305 | 6/2014 | ............ C09G 1/02 |
| CN | 107148496 | 9/2017 | ............ C23F 11/10 |
| CN | 107406752 | 11/2017 | ............ C09K 3/14 |
| JP | 2014-120189 | 6/2014 | ............ G11B 5/84 |
| KR | 10 2017 0010546 | 2/2017 | ............ C09K 3/14 |
| TW | 460431 | 10/2001 | ............ C04B 35/10 |
| TW | 200603297 | 1/2006 | ............ B24B 37/00 |
| TW | 200626706 | 8/2006 | ............ C09G 1/02 |
| TW | 201629182 | 8/2016 | ............ C09K 3/14 |
| TW | 201629269 | 8/2016 | ............ C23F 11/10 |
| TW | 201641663 | 12/2016 | |
| TW | 201726844 | 8/2017 | |
| TW | I596203 | 8/2017 | ............ C09K 3/14 |
| WO | WO 2014/079144 | 5/2014 | |
| WO | WO 2015/037301 | 3/2015 | ............ C09K 3/14 |

OTHER PUBLICATIONS

Office Action for Chinese Application No. CN 201910812800.6 dated Dec. 16, 2020 (with English Translation).

European Search Report for European Application No. EP 19 17 2460 dated Nov. 6, 2019.

European Search Report for European Application No. EP 19 17 3321 dated Nov. 6, 2019.

International Search Report and Written Opinion of the International Searching Authority for International Application No. PCT/US19/28924 dated Jul. 30, 2019.

International Search Report and Written Opinion of the International Searching Authority for International Application No. PCT/US19/29138 dated Aug. 2, 2019.

Taiwan Office Action and Search Report for Taiwan Application No. TW 1092333960 dated Apr. 13, 2020 (with English Machine Translation).

Second Office Action issued by the Chinese Patent Office for Chine Application No. CN 201910812800.6, dated Jun. 9, 2021 (with English Translation).

Taiwanese Office Action and Search Report for Taiwanese Application No. TW 108115090 dated Sep. 7, 2020 (with English summary).

Korean Notice of Preliminary Rejection for Korean Application No. KR 10-2019-0054849, dated Dec. 7, 2020 (with English Translation).

Korean Notice of Preliminary Rejection for Korean Application No. KR 10-2019-0054845, dated Dec. 7, 2020 (with English Translation).

Office Action and Search report issued by the Taiwan Patent Office for Application No. TW 110101387, dated Jul. 21, 2021 (with English summary).

Notification of Second Office Action issued by the Chinese Patent Office for Application No. CN 201910812821.8, dated Nov. 4, 2021 (with English Machine Translation).

Decision of Rejection issued by the Chinese Patent Office for Application No. CN 201910812821.8 dated Feb. 17, 2022 (with English Translation).

European Search Report issued by the European Patent Office for Application No. EP 21 20 6058 by Examiner Claudine Rangheard, dated Mar. 25, 2022.

Non-Final Office Action issued by the U.S. Patent and Trademark Office for Application No. U.S. Appl. No. 17/091,260 by Examiner Jiong-Ping Lu, dated Apr. 4, 2022.

US 11,424,131 B2

POLISHING COMPOSITIONS AND METHODS OF USING SAME

CROSS-REFERENCE TO RELATED APPLICATIONS

The present application is a continuation of U.S. application Ser. No. 16/356,685, filed on Mar. 18, 2019, which claims priority to U.S. Provisional Application Ser. No. 62/781,648, filed on Dec. 19, 2018. The contents of the parent applications are hereby incorporated by reference in their entirety.

BACKGROUND

The semiconductor industry is continually driven to improve chip performance by further miniaturization of devices through process and integration innovations. Chemical Mechanical Polishing/Planarization (CMP) is a powerful technology as it makes many complex integration schemes at the transistor level possible, thereby facilitating increased chip density.

SUMMARY

Transistors are generally fabricated at the Front End of Line (FEOL) transistor fabrication step. The FEOL material stack typically includes a metal gate and multiple stacks of dielectric materials. Electrical isolation of the billions of active components in each integrated circuit is a goal in FEOL and may be achieved using a shallow trench isolation (STI) process. A portion of a STI process is shown in FIG. 1 for demonstration purposes. As can be seen from FIG. 1, prior to the STI CMP process, thermal silicon oxide and SiN can be deposited on top of silicon (e.g., a silicon wafer) (FIG. 1 (a)) and then etched out to create trenches/isolation and "active" non-trench areas (to form transistor containing areas) (FIG. 1 (b)). Thereafter, these trench/isolation areas can be filled by depositing (e.g., by using plasma-enhanced chemical vapor deposition (PECVD)) silicon oxide (e.g., TEOS) in the trenches such that the active non-trench areas can be isolated by the silicon oxide in the trenches (FIG. 1 (c)). Thereafter, the "overburden/extra" silicon oxide above the active non-trench areas can be selectively removed while keeping silicon oxide in the shallow trenches (FIG. 1(d)). The selective removal of the silicon oxide is achieved by a shallow trench isolation (STI) chemical mechanical polishing/planarization (CMP) process, where a CMP slurry composition (such as that described in this disclosure) having a high material removal rate (MRR) selectivity of silicon oxide to silicon nitride (e.g., SiN) is used to remove silicon oxide at a high rate, preferably without substantially removing silicon nitride (a stop-on layer). After the above STI CMP step, etching can be used to expose silicon to complete the isolation and prevent adjacent transistors formed in the active non-trench areas from coming into contact with each other and thereby prevent shorting of electrical circuits.

The dielectric films prevalently used in STI are silicon nitride (e.g., SiN), silicon oxide (e.g., TEOS: tetra-ethyl ortho-silicate), poly-silicon (P-Si), silicon carbon nitride (e.g., SiCN), and low-k/ultra-low k dielectric films (e.g., SiCOH). With the introduction of high-k metal gate technology at 45 nm and FinFET technology at 22 nm chip production, SiN, TEOS, SiCN and P-Si films are starting to be used more often and in a greater number of applications in FEOL. Additionally, in Back End of Line (BEOL), as the resistivity of conventional barrier materials (e.g., Ta/TaN or Ti/TiN) has been shown to not effectively scale down for advanced sub-10 nm manufacturing nodes, these barrier materials can be replaced by dielectrics such as SiN, TEOS, SiCN, and P-Si for various BEOL material stacks. Thus, for both FEOL and BEOL, these dielectric films can be used as an etch stop layer, capping material, spacer material, additional liner, diffusion/passivation barrier, hard mask and/or stop-on layer.

In general, dielectric films are being used much more generously in advanced semiconductor manufacturing. From a CMP perspective, most of these integrations incorporating dielectrics require polishing compositions (slurries) that can work/polish and/or stop on these films, such as slurries that can remove SiN but not remove (stop on) TEOS/P-Si or slurries that can remove TEOS/p-Si but not remove (stop on) SiN.

The present disclosure relates to stable aqueous slurries that can selectively polish a wide variety of materials (e.g., oxides such as silicon oxides) while achieving very low polishing/removal rates on silicon nitride and associated silicon and nitrogen based films like SiCN (silicon carbonitride). For example, the polishing compositions can polish silicon oxide (e.g., $SiO_2$) at a relatively high material removal rate (MRR) and stop on or polish at very low rates silicon nitride (e.g., SiN) or related films. For example, silicon oxides that can be removed by the polishing compositions described herein include silicon oxides selected from TEOS, thermal oxides (TOX) (e.g., caused by autoclave induced oxidation of bare silicon), silicon oxides formed by plasma enhanced PVD deposition (e.g., high density plasma or high aspect ratio plasma), silicon oxides formed by CVD deposition with post plasma surface cure, carbon doped silicon oxide (SiOC), and silicon oxides formed by liquid application of an oxide precursor followed by light or thermal induced curing. In some instances, the target film to be removed at high MRRs can be a metal or a metal oxide or a metal nitride rather than silicon oxide dielectrics. Common examples of metals, metal oxides and metal nitrides include copper, cobalt, ruthenium, aluminum, titanium, tungsten, and tantalum for metals, hafnium oxide, titanium oxide, aluminum oxide, zirconium oxide and tantalum oxide for metal oxides and nitrides of ruthenium, aluminum, titanium, tungsten, and tantalum. For such instances, the stop-on/low removal rate film can still be a silicon nitride film and thus the polishing compositions containing the nitride removal rate reducing agent from this disclosure can be utilized to achieve a desired selectivity.

More particularly, the present disclosure relates to polishing compositions including an abrasive, a nitride removal rate reducing agent, an acid or base, water, and optionally, a dishing reducing agent (e.g., an anionic dishing agent). The pH of the polishing compositions described herein can be in the range of 2 to 6.5 or, more specifically, in the range of 2 to 4.5 range. The compositions of the present disclosure can also be diluted (e.g., at the point of use) to form a polishing composition without any deterioration in performance. This disclosure also discusses methods for polishing semiconductor substrates using the aforementioned polishing compositions.

In one aspect, embodiments disclosed herein relate to a polishing composition, including at least one abrasive, at least one nitride removal rate reducing agent, an acid or a base, and water. The nitride removal rate reducing agent includes a hydrophobic portion containing a $C_{12}$ to $C_{40}$ hydrocarbon group; and a hydrophilic portion containing at least one group selected from the group consisting of a sulfinite group, a sulfate group, a sulfonate group, a carboxylate group, a phosphate group, and a phosphonate group; and wherein the hydrophobic portion and the hydrophilic portion are separated by zero to ten alkylene oxide groups. The polishing composition has a pH of about 2 to about 6.5.

In another aspect, embodiments disclosed herein relate to a polishing composition including: at least one abrasive; at least one nitride removal rate reducing agent including a hydrophobic portion and a hydrophilic portion; an acid or a base; and water; wherein the polishing composition has a pH of about 2 to about 6.5; and the polishing composition has a ratio of a removal rate for a silicon oxide to a removal rate for a silicon nitride of at least about 3:1 during polishing a patterned wafer including at least silicon nitride patterns, in which the silicon nitride patterns are overlayed with at least silicon oxide (and optionally other materials such as metals or dielectrics).

In yet another aspect, embodiments disclosed herein relate to a polishing composition including: at least one abrasive; at least one nitride removal rate reducing agent including a hydrophobic portion and a hydrophilic portion; an acid or a base; and water; wherein the polishing composition has a pH of about 2 to about 6.5; and wherein less than about 1000 angstroms of silicon oxide dishing occurs when polishing a patterned wafer including at least silicon nitride patterns overlayed with at least silicon oxide with the polishing composition, in which the polishing exposes the silicon nitride patterns on the patterned wafer.

In yet another aspect, embodiments disclosed herein relate to a polishing composition including: at least one abrasive; at least one nitride removal rate reducing agent including a hydrophobic portion and a hydrophilic portion; an acid or a base; and water; wherein the polishing composition has a pH of about 2 to about 6.5; and wherein less than about 500 angstroms of silicon nitride erosion occurs when polishing a patterned wafer including at least silicon nitride patterns overlayed with at least silicon oxide with the polishing composition, in which the polishing exposes the silicon nitride patterns on the patterned wafer.

In yet another aspect, embodiments disclosed herein relate to a method, including: applying a polishing composition described herein to a substrate having at least silicon nitride and at least silicon oxide on a surface of the substrate; and bringing a pad into contact with the surface of the substrate and moving the pad in relation to the substrate.

The synergistic use of abrasive, the nitride RR reducing agent, and the optional dishing reducing agent in the same composition provides unique advantages not found in currently available slurries. Among others, these benefits include the following:

1. The compositions described herein can achieve very low silicon nitride (e.g., SiN) removal rates. Superior silicon nitride protection can be achieved through judicious selection and formulation/loading of the silicon nitride removal rate reducing agent. Furthermore, low silicon nitride removal rates are observed on both blanket wafers (i.e., wafers containing only silicon nitride film) and patterned wafers (i.e., wafers containing silicon nitride film and other films, for example TEOS, etched in a pattern) as demonstrated in this disclosure.
2. The very low silicon nitride removal rates enable obtaining minimal silicon nitride loss and thereby very low silicon nitride erosion post-polishing on patterned wafers.
3. The compositions can achieve low silicon oxide dishing/step-height. Dishing performance can be tuned with judicious selection and loading/concentration of the dishing reducing agent.
4. The compositions are compatible with a wide variety of abrasives. Through particle modification, the zeta potential of the abrasive can be tuned to further modulate removal rates on the target film. Anionic, cationic, and neutral abrasives are all capable of forming stable slurries with higher silicon oxide removal rates and comparably lower silicon nitride removal rates.
5. The compositions can form stable slurries with high purity colloidal silica as the abrasive. This allows for the creation of slurries with low trace metal counts and low large particle counts, resulting in reduced defects on the polished wafers, when compared with wafers polished with conventionally used ceria abrasives (which generally generates a large amount of defects on a polished wafer). In addition, the compositions described herein can overcome certain disadvantages of conventional silica-based STI CMP compositions, such as their high silicon nitride removal rates and low removal selectivity between silicon oxide and silicon nitride.
6. The compositions produce low nitride removal rates across a variety of polish conditions. For example, silicon nitride removal rates remain low on both hard polish pads (e.g., polyurethane based pads) and soft polish pads (e.g., poromeric and low shore D hardness value pads). Additionally, it has been observed that downforce and velocity do not appreciably affect silicon nitride removal rates, which is a good CMP attribute to have as the stop-on film behavior is non-prestonian. The fact that the compositions of the present disclosure exhibit little variation in removal rates as a function of pressure and velocity leads to very good topography and high yields post patterned wafer polishing. In the language of the field, compositions of the present disclosure lead to low values for silicon oxide dishing and step height along with low values of silicon nitride erosion/loss.

The polishing compositions and concentrates discussed in this disclosure contrast with currently available contemporary slurries in providing performance sustenance on current generation integrated circuit substrates, whereas simultaneously displaying marked advantages for next generation substrates and integration schemes. The compositions of the present disclosure can successfully and efficiently remove a variety of metal and dielectric layers with very high selectivity over removing the silicon nitride layers. The compositions can be used for shallow trench isolation (STI) processes, self-aligned contact processes, or other processes where very low silicon nitride material removal rate is desired.

DETAILED DESCRIPTION OF THE DISCLOSURE

Figure 1:
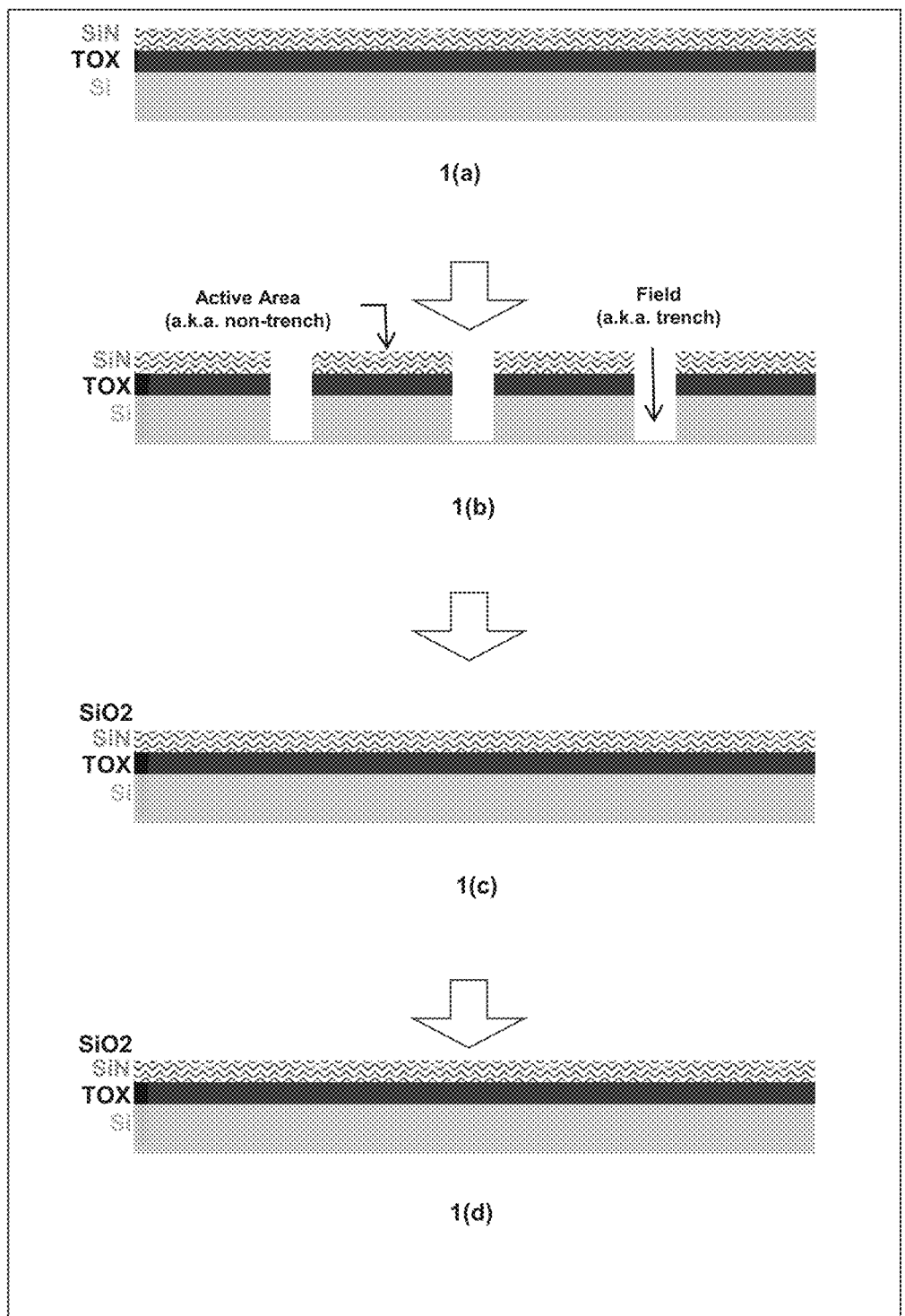
FIG. 1 is a schematic diagram of a process flow in a shallow trench isolation (STI) processes (including STI CMP) in semiconductor fabrication.

The present disclosure relates to polishing compositions, and methods for polishing semiconductor substrates using the same. In some embodiments, this disclosure relates to selectively polishing silicon oxide surfaces over silicon nitride surfaces. The selective polishing of silicon oxide over silicon nitride is a critical process in semiconductor manufacturing and is commonly performed during the shallow trench isolation (STI) process. Conventionally, STI polishing compositions (slurries) utilize ceria abrasives to achieve the required polishing performance (e.g., selectivity) in the STI process because compositions that use silica abrasives have not performed adequately (e.g., high silicon nitride removal rates). However, ceria abrasives are known to give high rates of defectivity and scratches when used in polishing compositions due to their "inorganic hard" nature. Further, ceria-based polishing compositions exhibit a shorter shelf life (e.g., lower storage capability, lower useable time period, and earlier expiration date), a shorter pot life (e.g., activity after opening container and/or in a holding tank or distribution loop) than silica-based polishing compositions, and ceria has greater price volatility than silica. In addition, ceria includes a rare earth metal and is more expensive than silica. Compositions according to this disclosure allow for the use of silica abrasives, which are softer than ceria abrasives, for STI slurries. The silica containing polishing compositions can give very good selectivity in material removal rates (MRR) of silicon oxide (e.g., TEOS) over silicon nitride (e.g., SiN), while also providing polished wafer surfaces with a very low defectivity when compared to STI processes that utilize a ceria abrasive. Thus, the polishing compositions according to the present application are capable of increasing the device yield of the wafers when compared with conventional polishing compositions that utilize ceria abrasives.

The polishing compositions described herein can include (a) an abrasive, (b) a nitride removal rate reducing agent, (c) an acid or base, (d) water, and optionally (e) a dishing reducing agent (e.g., an anionic dishing reducing agent). The polishing composition can have a pH of at least about 2 to at most about 6.5. The polishing compositions of the present disclosure can have a high selectivity for polishing dielectrics or metals over polishing silicon nitrides. The present disclosure also provides a method of using the polishing compositions to polish semiconductor substrates. Particularly, the present disclosure provides a method for polishing dielectrics or metals with high selectivity over silicon nitrides.

In one or more embodiments, the at least one (e.g., two or three) abrasive is selected from cationic abrasives, substantially neutral abrasives, and anionic abrasives. In one or more embodiments, the at least one abrasive is selected from the group consisting of alumina, silica, titania, ceria, zirconia, co-formed products thereof, coated abrasives, surface modified abrasives, and mixtures thereof. In some embodiments, the at least one abrasive does not include ceria.

In one or more embodiments, the abrasive is a silica-based abrasive, such as one selected from the group consisting of colloidal silica, fumed silica, and mixtures thereof. In one or more embodiments, the abrasive has a surface modified with organic groups and/or non-siliceous inorganic groups. For example, the cationic abrasive can include terminal groups of formula (I):

$$—O_m—X—(CH_2)_n—Y \qquad (I),$$

in which m is an integer from 1 to 3; n is an integer from 1 to 10; X is Al, Si, Ti, or Zr; and Y is a cationic amino or thiol group. As another example, the anionic abrasive can include terminal groups of formula (I):

$$—O_n—X—(CH_2)_n—Y \qquad (I),$$

in which m is an integer from 1 to 3; n is an integer from 1 to 10; X is Al, Si, Ti, or Zr; and Y is an acid group. In some embodiments, the at least one abrasive can be present in a polishing composition described herein in an amount of from at least about 0.05 wt % (e.g., at least about 0.1 wt %, at least about 0.5 wt %, at least about 1 wt %, at least about 2 wt %, at least about 3 wt %, or at least about 5 wt %) to at most about 20 wt % (e.g., at most about 15 wt %, at most about 10 wt %, at most about 8 wt %, at most about 6 wt %, at most about 4 wt %, or at most about 2 wt %) based on the total weight of the composition.

In one or more embodiments, the abrasive described herein can have a mean particle size of at least about 1 nm (e.g., at least about 5 nm, at least about 10 nm, at least about 20 nm, at least about 40 nm, at least about 50 nm, at least about 60 nm, at least about 80 nm, or at least about 100 nm) to at most about 1000 nm (e.g., at most about 800 nm, at most about 600 nm, at most about 500 nm, at most about 400 nm, or at most about 200 nm). As used herein, the mean particle size (MPS) is determined by dynamic light scattering techniques.

In one or more embodiments, the at least one (e.g., two or three distinct) nitride removal rate reducing agent is a compound that includes a hydrophobic portion containing a $C_{12}$ to $C_{40}$ hydrocarbon group (e.g., containing an alkyl group and/or an alkenyl group); and a hydrophilic portion containing at least one group selected from the group consisting of a sulfinite group, a sulfate group, a sulfonate group, a carboxylate group, a phosphate group, and a phosphonate group. In one or more embodiments, the hydrophobic portion and the hydrophilic portion are separated by zero to ten (e.g., 1, 2, 3, 4, 5, 6, 7, 8, or 9) alkylene oxide groups (e.g., $—(CH_2)_nO—$ groups in which n can be 1, 2, 3, or 4). In one or more embodiments, the nitride removal rate reducing agent has zero alkylene oxide groups separating the hydrophobic portion and the hydrophilic portion. Without wishing to be bound by theory, it is believed that the presence of alkylene oxide groups within the nitride removal rate reducing agent may not be preferred in some embodiments as they may create slurry stability issues and increase silicon nitride removal rate.

In one or more embodiments, the nitride removal rate reducing agent is included in a polishing composition described herein in an amount from at least about 0.1 ppm (e.g., at least about 0.5 ppm, at least about 1 ppm, at least about 5 ppm, at least about 10 ppm, at least about 25 ppm, at least about 50 ppm, at least about 75 ppm, or at least about 100 ppm) to at most about 1000 ppm (e.g., at most about 900 ppm, at most about 800 ppm, at most about 700 ppm, at most about 600 ppm, at most about 500 ppm, or at most about 250 ppm) based on the total weight of the composition.

In one or more embodiments, the nitride removal rate reducing agent has a hydrophobic portion containing a hydrocarbon group that includes at least 12 carbon atoms ($C_{12}$) (e.g., at least 14 carbon atoms ($C_{14}$), at least 16 carbon atoms ($C_{16}$), at least 18 carbon atoms ($C_{18}$), at least 20 carbon atoms ($C_{20}$), or at least 22 carbon atoms ($C_{22}$)) and/or at most 40 carbon atoms ($C_{34}$) (e.g., at most 38 carbon atoms ($C_{38}$), at most 36 carbon atoms ($C_{36}$), at most 34 carbon atoms ($C_{34}$), at most 32 carbon atoms ($C_{32}$), at most 30 carbon atoms ($C_{30}$), at most 28 carbon atoms ($C_{28}$), at most 26 carbon atoms ($C_{26}$), at most 24 carbon atoms ($C_{24}$), or at most 22 carbon atoms ($C_{22}$)). The hydrocarbon groups mentioned herein refer to groups that contain only carbon and hydrogen atoms and can include both saturated groups (e.g., linear, branched, or cyclic alkyl groups) and unsaturated groups (e.g., linear, branched, or cyclic alkenyl groups; linear, branched, or cyclic alkynyl groups; or aromatic groups (e.g., phenyl or naphthyl)). In one or more embodiments, the hydrophilic portion of the nitride removal rate reducing agent contains at least one group selected from a phosphate group and a phosphonate group. It is to be noted that the term "phosphonate group" is expressly intended to include phosphonic acid groups.

In one or more embodiments, the nitride removal rate reducing agent is selected from the group consisting of napthalenesulfonic acid-formalin condensate, lauryl phosphate, myristyl phosphate, stearyl phosphate, octadecylphosphonic acid, oleyl phosphate, behenyl phosphate, octadecyl sulfate, lacceryl phosphate, oleth-3-phosphate, and oleth-10-phosphate.

In one or more embodiments, the polishing compositions described herein optionally further include at least one (e.g., two or three) dishing reducing agent (e.g., anionic dishing reducing agent). In one or more embodiments, the at least one dishing reducing agent is a compound including at least one group selected from the group consisting of hydroxy, sulfate, phosphonate, phosphate, sulfonate, amine, nitrate, nitrite, carboxylate, and carbonate groups. In one or more embodiments, the at least one dishing reducing agent is at least one selected from the group consisting of a polysaccharide and a substituted polysaccharide. In one or more embodiments, the at least one dishing reducing agent is at least one selected from the group consisting of carrageenan, xanthan gum, hydroxypropyl cellulose, methyl cellulose, ethyl cellulose, hydroxypropyl methylcellulose, and carboxymethylcellulose. In one or more embodiments, the at least one nitride removal rate reducing agent and the at least one dishing reducing agent are chemically distinct from each other.

In one or more embodiments, the dishing reducing agent is included in a polishing composition described herein in an amount from at least about 0.1 ppm (e.g., at least about 0.5 ppm, at least about 1 ppm, at least about 5 ppm, at least about 10 ppm, at least about 25 ppm, at least about 50 ppm, at least about 75 ppm, or at least about 100 ppm) to at most about 1000 ppm (e.g., at most about 900 ppm, at most about 800 ppm, at most about 700 ppm, at most about 600 ppm, or at most about 500 ppm) based on the total weight of the composition.

In one or more embodiments, the acid is selected from the group consisting of formic acid, acetic acid, malonic acid, citric acid, propionic acid, malic acid, adipic acid, succinic acid, lactic acid, oxalic acid, hydroxyethylidene diphosphonic acid, 2-phosphono-1,2,4-butane tricarboxylic acid, aminotrimethylene phosphonic acid, hexamethylenediamine tetra(methylenephosphonic acid), bis(hexamethylene)triamine phosphonic acid, amino acetic acid, peracetic acid, potassium acetate, phenoxyacetic acid, glycine, bicine, diglycolic acid, glyceric acid, tricine, alanine, histidine, valine, phenylalanine, proline, glutamine, aspartic acid, glutamic acid, arginine, lysine, tyrosine, benzoic acid, nitric acid, sulfuric acid, sulfurous acid, phosphoric acid, phosphonic acid, hydrochloric acid, periodic acid, and mixtures thereof.

In one or more embodiments, the base is selected from the group consisting of potassium hydroxide, sodium hydroxide, cesium hydroxide, ammonium hydroxide, triethanolamine, diethanolamine, monoethanolamine, tetrabutylammonium hydroxide, tetramethylammonium hydroxide, lithium hydroxide, imidazole, triazole, aminotriazole, tetrazole, benzotriazole, tolytriazole, pyrazole, isothiazole, and mixtures thereof.

In one or more embodiments, the acid or base can be present in a polishing composition described herein in an amount of from at least about 0.01 wt % (e.g., at least about 0.05 wt %, at least about 0.1 wt %, at least about 0.5 wt %, or at least about 1 wt %) to at most about 10 wt % (e.g., at most about 8 wt %, at most about 6 wt %, at most about 5 wt %, at most about 4 wt %, or at most about 2 wt %) based on the total weight of the composition. For example, the acid or base can be added in an amount sufficient to adjust the pH of a polishing composition to the desired value.

In one or more embodiments, the water can be present in a polishing composition described herein (e.g., as a liquid medium or carrier) in an amount of from at least about 50 wt % (e.g., at least about 55 wt %, at least about 60 wt %, at least about 65 wt %, at least about 70 wt %, or at least about 75 wt %) to at most about 99.9 wt % (e.g., at most about 99.5 wt %, at most about 99 wt %, at most about 97 wt %, at most about 95 wt %, or at most about 90 wt %) based on the total weight of the composition.

In one or more embodiments, the polishing compositions described herein can have a pH of at least about 2 (e.g., at least about 2.5, at least about 3, at least about 3.5, or at least about 4) to at most about 6.5 (e.g., at most about 6, at most about 5.5, or at most about 5, or at most about 4.5). Without wishing to be bound by theory, it is believed that a polishing composition having a pH above 6.5 may reduce the silicon oxide/silicon nitride removal rate selectivity and have stability issues.

In one or more embodiments, the polishing compositions described herein can be substantially free of one or more of certain ingredients, such as salts (e.g., halide salts), polymers (e.g., cationic or anionic polymers, or polymers other than a dishing reducing agent), surfactants (e.g., those other than a nitride removal rate reducing agent), plasticizers, oxidizing agents, corrosion inhibitors (e.g., azole or non-azole corrosion inhibitors), and/or certain abrasives (e.g., ceria abrasives or non-ionic abrasives). The halide salts that can be excluded from the polishing compositions include alkali metal halides (e.g., sodium halides or potassium halides) or ammonium halides (e.g., ammonium chloride), and can be chlorides, bromides, or iodides. As used herein, an ingredient that is "substantially free" from a polishing composition refers to an ingredient that is not intentionally added into the polishing composition. In some embodiments, the polishing compositions described herein can have at most about 1000 ppm (e.g., at most about 500 ppm, at most about 250 ppm, at most about 100 ppm, at most about 50 ppm, at most about 10 ppm, or at most about 1 ppm) of one or more of the above ingredients that are substantially free from the polishing compositions. In some embodiments, the polishing compositions described can be completely free of one or more the above ingredients.

In one or more embodiments, the polishing compositions described herein have a ratio of a removal rate for silicon oxide (e.g., TEOS) to a removal rate for silicon nitride (i.e., a removal rate selectivity) of at least about 3:1, or at least about 4:1, or at least about 5:1, or at least about 10:1, or at least about 25:1, or at least about 50:1, or at least about 60:1, or at least about 75:1, or at least about 100:1, or at least about 150:1, or at least about 200:1, or at least about 250:1, or at least about 300:1, or at least about 500:1, or at least about 750:1, or at most about 1000:1, or at most about 5000:1. In one or more embodiments, the ratios described above can be applicable when measuring removal rates for polishing either blanket wafers or patterned wafers (i.e., wafers including at least silicon nitride patterns, in which the silicon nitride patters are overlayed with at least silicon oxide (and optionally with other materials such as metals and dielectrics)).

In one or more embodiments, at most about 1000 angstroms, at most about 500 angstroms, or at most about 375 angstroms, or at most about 250 angstroms, or at most about 200 angstroms, or at most about 100 angstroms, or at most about 50 angstroms, and/or at least about 0 angstrom of silicon oxide (e.g., TEOS) dishing occurs when polishing a patterned wafer (which can include at least silicon nitride patterns overlayed with at least silicon oxide) with the polishing composition (e.g., until the polishing exposes the silicon nitride patterns on the patterned wafer). In one or more embodiments, at most about 500 angstroms, or at most about 400 angstroms, or at most about 300 angstroms, or at most about 250 angstroms, at most about 200 angstroms, at most about 100 angstroms, or at most about 75 angstroms, or at most about 65 angstroms, or at most about 50 angstroms, or at most about 32 angstroms and/or at least about 0 angstrom of silicon nitride erosion occurs when polishing a patterned wafer (which can include at least silicon nitride patterns overlayed with at least silicon oxide) with the polishing composition (e.g., until the polishing exposes the silicon nitride patters on the patterned wafer).

In one or more embodiments, the planarization efficiency (i.e., the change in silicon oxide step height divided by the amount of silicon oxide removed during the polish, multiplied by 100) is at least about 14% (e.g., at least about 20%, at least about 30%, at least about 38%, at least about 40%, at least about 46%, at least about 50%, at least about 60%, at least about 70%, or at least about 74%) and at most about 100% (e.g., at most about 99.9%, at most about 99%, at most about 95%, at most about 90%, at most about 80%, at most about 70%, and at most about 60%) when polishing a patterned wafer using a polishing composition according to the present disclosure. In one or more embodiments, the total defect counts on a patterned wafer having a diameter of 12 inches (i.e., about 300 mm) is at most 175 (e.g., at most 170, at most 160, at most 150, at most 125, at most 100, at most 75, at most 50, at most 25, at most 10, or at most 5) when polishing the patterned wafer using a polishing composition according to the present disclosure (e.g., a composition including a silica abrasive and the nitride removal rate reducing agent). As described herein, the defects counted are those at least about 90 nm in size.

In one or more embodiments, this disclosure features a method of polishing that can include applying a polishing composition according to the present disclosure to a substrate (e.g., a wafer) having at least silicon nitride and silicon oxide on a surface of the substrate; and bringing a pad into contact with the surface of the substrate and moving the pad in relation to the substrate. In some embodiments, when the substrate includes at least silicon nitride patterns overlayed with at least silicon oxide (e.g., silicon oxide in the presence of other materials such as silicon based dielectrics (e.g., silicon carbide, etc.), metals, metal oxides and nitrides, etc.), the above method can remove at least a portion of the silicon oxide (e.g., the silicon oxide on active, non-trench areas) to expose silicon nitride. It is to be noted that the terms "silicon nitride" and "silicon oxide" described herein are expressly intended to include both un-doped and doped versions of silicon nitride and/or silicon oxide. For example, in one or more embodiments, the silicon nitride and silicon oxide can, independently, be doped with at least one dopant selected from carbon, nitrogen (for silicon oxide), oxygen, hydrogen, or any other known dopants for silicon nitride or silicon oxide. Some examples of silicon oxide film types include TEOS (Tetra-ethyl orthosilicate), SiOC, SiOCN, SiOCH, SiOH and SiON, to name a few. Some examples of silicon nitride film types include SiN (pure silicon nitride), SiCN, SiCNH, and SiNH, to name a few.

In some embodiments, the method that uses a polishing composition described herein can further include one or more additional steps to produce a semiconductor device from the substrate treated by the polishing composition. For example, the method can include one or more of the following steps prior to the polishing method described above: (1) depositing silicon oxide (e.g., thermal silicon oxide) on a substrate (e.g., a silicon wafer) to form a silicon oxide layer, (2) depositing silicon nitride on the silicon oxide layer to form a silicon nitride layer, (3) etching the substrate to form trenches and non-trench areas, and (4) depositing silicon oxide to the etched substrate to fill the trenches with silicon oxide. As another example, the method can include at least one additional step after the polishing method described above, such as etching the substrate (e.g., to remove silicon nitride and silicon oxide) to expose silicon and/or silicon oxide or other heterogeneous films on the wafer substrate.

EXAMPLES

Examples are provided to further illustrate the capabilities of the polishing compositions and methods of the present disclosure. The provided examples are not intended and should not be construed to limit the scope of the present disclosure. Any percentages listed are by weight (wt %) unless otherwise specified. The nitride removal rate reducing agents described in the examples were obtained a variety of suppliers and may, in some instances, include minor amounts of similar compounds having carbon chain lengths smaller or larger than what is specified in the tables below. The carbon chain length specified in the tables identifies the majority component of the nitride removal rate reducing agent.

Example 1: Demonstration of Nitride Stop

In this example, polishing compositions used in samples 1A-1F primarily included: 3 w/w % neutral colloidal silica abrasive, malonic acid as a pH adjuster, a nitride removal rate reducing agent (if present), and water as a liquid carrier. The pH of the polishing compositions was 2.3. An Applied Materials Mirra CMP polisher was used with a downforce of 2 psi and a flow rate of 175 mL/min to polish on a Dow VP6000 pad 200 mm silicon oxide (TEOS) and silicon nitride (SiN) blanket wafers.

TABLE 1

TEOS and SiN removal rates vs. nitride removal rate reducing surfactant species

| Sample | Nitride Removal Rate Reducing Agent | EO Groups | TEOS RR [Å/min] | SIN RR [Å/min] | TEOS RR/SIN RR |
|---|---|---|---|---|---|
| Control | None | 0 | 982 | 121 | 8 |
| 1A | stearyl phosphate | 0 | 816 | 2 | 408 |
| 1B | n-Octadecylphosphonate | 0 | 868 | 1 | 868 |
| 1C | Oleyl phosphate | 0 | 965 | 4 | 241 |
| 1D | Octadecyl sulfate | 0 | 854 | 1 | 854 |
| 1E | Oleth-3 phosphate | 3 | 790 | 10 | 79 |
| 1F | Oleth-10 phosphate | 10 | 629 | 7 | 90 |

"EO" refers to ethylene oxide.
"RR" refers to removal rate.

The results in Table 1 showed that the control polishing composition (which did not include a nitride removal rate reducing agent) had a removal rate selectivity between silicon oxide and silicon nitride of 8, which is too low for most applications requiring low silicon nitride rates. However, with the addition of a nitride removal rate reducing agent, the silicon nitride removal rates of the polishing compositions dropped to as low as 1 Å/min and the removal rate selectivity climbed to as high as 868.

Example 2: Demonstration of pH Range and Different Abrasive Surface Charge

In this example, polishing compositions used in samples 2A-21 included: 3 w/w % colloidal silica abrasive, an organic acid as a pH adjuster, n-octadecylphosphonic acid, and water as a liquid carrier. n-Octadecylphosphonic acid is representative of the class of nitride removal rate reducing agent described herein. Furthermore, in this example, the colloidal silica charge was varied by using neutral, cationic, and anionic silica, as shown in Table 2. The pH of the polishing compositions was varied from about 2.25 to about 4.25. An Applied Materials Mirra CMP polisher was used with a downforce of 2 psi and a flow rate of 175 mL/min on a Dow VP6000 pad to polish 200 mm silicon oxide (TEOS) and silicon nitride blanket wafers.

TABLE 2

TEOS and SiN removal rates vs. pH with three types of Silica

| Sample | Abrasive | n-octadecyl-phosphonic acid relative concentration | pH | TEOS RR [Å/min] | SIN RR [Å/min] | TEOS RR/ SIN RR |
|---|---|---|---|---|---|---|
| 2A | Neutral Silica | x | 2.25 | 925 | 3 | 308 |
| 2B | | x | 2.75 | 1186 | 2 | 593 |
| 2C | | x | 3.50 | 921 | 3 | 307 |
| 2D | | x | 4.25 | 587 | 9 | 65 |
| 2E | Cationic Silica | 2x | 2.75 | 389 | 2 | 194 |
| 2F | | 2x | 3.50 | 458 | 2 | 229 |
| 2G | | 2x | 4.25 | 815 | 2 | 407 |
| 2H | Anionic Silica | 2x | 2.25 | 47 | 27 | 2 |
| 2I | | 2x | 3.25 | 44 | 13 | 3 |

As shown in Table 2, the nitride removal rate reducing agent was capable of controlling silicon nitride removal rates with neutral, cationic, and anionic silica from a pH range of about 2.25 to about 4.25. The robust nitride rate reduction of the above system irrespective of the surface charge of the silica abrasive is surprising. For example, it is commonly thought that cationic abrasives would have poor compatibility with anionic nitride removal rate reducing agent. In contrast, in this system the slurry remained stable and the nitride removal rate reducing agent remained active.

Conventionally, silicon nitride removal rates when using anionic abrasives are generally very high (~400 Å/min) and difficult to control. Significantly, the nitride removal rate reducing agents described herein were capable of significantly reducing silicon nitride removal rates. This type of system may be useful when low TEOS and silicon nitride removal rates are desired with high removal rates on a film that is polished well by anionic abrasives (e.g., a silicon carbide film).

Example 3: Demonstration of the Effect of Chain Length and Head Type of a Nitride Removal Rate Reducing Agent In this example, polishing compositions used in samples 3A-3L included: 3 w/w % colloidal silica abrasive, malonic acid as a pH adjuster, a nitride removal rate reducing agent shown in Table 3, and water as a liquid carrier. The pH of the polishing compositions was 2.25. Specifically, the nitride removal rate reducing agents used in samples 3A-3L included the head type and hydrophobe described In Table 3 without any alkylene oxide group. In addition, the nitride removal rate reducing agents used in samples 3I, 3J, and 3K included a mixture of surfactants, in which lauryl/myristyl phosphate, stearyl phosphate, and lacceryl phosphate are respectively the predominate components.

An Applied Materials Mirra CMP polisher was used with a downforce of 2 psi and a flow rate of 175 mL/min on a Dow VP6000 pad to polish 200 mm silicon oxide (TEOS) and silicon nitride blanket wafers.

TABLE 3

TEOS and SiN removal rates vs. the head group and hydrophobe of the nitride removal rate reducing agent

| Sample | Head Type | Hydrophobe | TEOS RR [Å/min] | SiN RR [Å/min] | TEOS RR/SiN RR |
|---|---|---|---|---|---|
| 3A | Phosphonate | n-hexyl | 953 | 157 | 6 |
| 3B | Phosphonate | n-octyl | 906 | 138 | 7 |
| 3C | Phosphonate | n-decyl | 895 | 146 | 6 |
| 3D | Phosphonate | n-dodecyl | 940 | 3 | 313 |
| 3E | Phosphonate | n-tetradecyl | 919 | 3 | 306 |
| 3F | Phosphonate | n-hexadecyl | 855 | 2 | 427 |
| 3G | Phosphonate | n-octadecyl | 811 | 2 | 405 |
| 3H | Phosphate | Hexyl (C6) | 946 | 139 | 7 |
| 3I | Phosphate | Lauryl/Myristyl (C12/C14) | 925 | 4 | 231 |
| 3J | Phosphate | Stearyl (C18) | 835 | 3 | 279 |
| 3K | Phosphate | Behenyl (C22) | 828 | 2 | 414 |
| 3L | Phosphate | Lacceryl (C32) | 898 | 23 | 39 |

As shown in Table 3, the size of the hydrophobe in the nitride removal rate reducing agent plays an important role in determining the efficacy of the rate reduction of silicon nitride. Table 3 shows that, among the agents tested, a chain length of 12 or greater performs best for an effective nitride stop under the tested conditions. A carbon chain length of 12 or greater (see samples 3D, 3E, 3F, 3G, 3I, 3J, 3K, and 3L in Table 3) in the nitride removal rate reducing agent ensures low SiN RR (typically <5 Å/min) and generates high selectivity ratio for TEOS:SiN RR (>250) for blanket films. Thus, such polishing compositions are ideally suited for STI CMP processes where a high selectivity ratio of silicon oxide to silicon nitride is desired.

Example 4: Demonstration of Downforce Effects

In this example, polishing compositions used in samples 4A-4C included: 3 w/w % colloidal silica abrasive, an organic acid as a pH adjuster, n-octadecylphosphonic acid, and water as a liquid carrier. The pH of the polishing compositions was between 2 and 6.5. An Applied Materials Mirra CMP polisher was used with a downforce of 2, 3, and 4 psi and a flow rate of 175 mL/min on a Dow IC1010 pad to polish 200 mm high density plasma (HDP) silicon oxide, tetraethyl orthosilicate oxide (TEOS), borophosphosilicate glass (BPSG), and silicon nitride coated wafers.

TABLE 4

HDP, TEOS, BPSG, and SiN removal rates vs. downforce

| Sample | Pressure [psi] | HDP RR [Å/min] | TEOS RR [Å/min] | BPSG RR [Å/min] | SiN RR [Å/min] |
|---|---|---|---|---|---|
| 4A | 2 | 1147 | 1835 | 4971 | 4 |
| 4B | 3 | 1506 | 2324 | 6675 | 2 |
| 4C | 4 | 1752 | 3140 | 8173 | 1 |

As shown in Table 4, silicon oxide films (HDP, TEOS, and BPSG) exhibited Prestonian behavior while silicon nitride removal rates exhibited non-Prestonian behavior and remained well controlled regardless of the downforce applied. In CMP language, Prestonian behavior of removal rates implies that the polishing rates increase linearly with increase in polishing pressure and/or angular velocity/rpm (revolutions per minute) of the polisher. For the high rate target film, a Prestonian behavior is desirable (silicon oxide films herein). A non-Prestonian behavior implies that the polishing rates do not change appreciably with change in pressure or velocity. Non-Prestonian behavior is somewhat desirable for the stop on film (SiN herein). As seen in Table 4, the removal rates of silicon oxide films increase linearly/Prestonianly with increase in downforce (e.g., TEOS RR increases from 1835 to 2324 to 3140 Å/min with increase in downforce from 2 to 3 to 4 psi pressure). Conversely, SiN (stop on film) removal rates do not change appreciably with increase in pressure (i.e., SiN RR fluctuates from 4 to 2 to 1 Å/min with increase in downforce from 2 to 3 to 4 psi pressure). In addition, this example proves that the polishing compositions have similar behavior on silicon oxide family of films as defined earlier. To further clarify, in Table 4, we depict three examples of silicon oxide films: HDP, TEOS & BPSG. The polishing compositions of this disclosure work very effectively in giving high material removal rates on all the different types of silicon oxide films. Equivalent experiments using examples of different kinds of silicon nitride films (SiN, SiCN, etc.) showed similar slurry stopping behavior as those achieved on the SiN films depicted in Table 4. Only the SiN film rates are depicted in Table 4 for simplicity.

Example 5: Demonstration of Pad Effect

In this example, polishing compositions used in samples 5A-5C included: 3 w/w % colloidal silica abrasive, an organic acid as a pH adjuster, a nitride removal rate reducing agent, and water as a liquid carrier. The pH of the polishing compositions was between 2 and 6.5. An Applied Materials Mirra CMP polisher was used with a downforce of 2 psi and a flow rate of 175 mL/min on a Dow VP6000 or Fujibo H800 pad to polish 200 mm tetraethyl orthosilicate oxide (TEOS) and silicon nitride (SiN) blanket wafers.

TABLE 5

TEOS and SiN removal rates vs. pad and nitride removal rate reducing agent

| Sample | Pad | Nitride Removal Rate Reducing Agent | TEOS RR [Å/min] | SiN RR [Å/min] | TEOS RR/SiN RR |
|---|---|---|---|---|---|
| 5A | Dow VP6000 | stearyl phosphate | 745 | 2 | 373 |
| 5B | | n-octadecyl phosphonate | 756 | 1 | 756 |
| 5C | | Oleyl phosphate | 835 | 3 | 278 |
| 5A | Fujibo H800 | stearyl phosphate | 951 | 8 | 119 |
| 5B | | n-octadecyl phosphonate | 942 | 2 | 471 |
| 5C | | Oleyl phosphate | 970 | 61 | 16 |

As shown in Table 5, the nitride removal rate reducing agent had an effect on silicon nitride protection. On the Dow VP6000 pad, which has a medium hardness, all samples (5A-5C) provided effective nitride protection as demonstrated by low SiN removal rates and high TEOS/SiN removal rate selectivity. However, on the Fujibo H800 pad, which is a soft pad, only samples containing nitride removal rate reducing agents with long-chain saturated hydrophobes (5A, 5B) provided an effective nitride stop. Thus, this example demonstrates that the polishing compositions of this disclosure work effectively on all kinds of polishing pads. Further, this example suggests the trend that nitride protection is increased when the nitride removal rate reducing agent includes longer hydrophobes, is more saturated, and/or is more hydrophobic.

Example 6: Demonstration of Dishing Reduction

In this example, polishing compositions used in samples 6A-6D included: 3 w/w % colloidal silica abrasive, an organic acid as a pH adjuster, n-octadecylphosphonic acid, anionic dishing reducing polymer (if present), and water as a liquid carrier. The pH of the polishing compositions was 3.0. An Applied Materials Mirra CMP polisher was used with a downforce of 2 psi and a flow rate of 175 mL/min on a Dow VP6000 pad to polish 200 mm STI 1 silicon oxide/silicon nitride patterned wafer. The wafers were end pointed by laser measurement after about 50 seconds and a 20 second over-polish.

TABLE 6

Effect of anionic dishing reducing polymer on oxide dishing

| Sample | Anionic dishing reducing polymer | Dishing [Å] 5 μm features \| 50% dense | Dishing [Å] 20 μm features \| 50% dense |
|---|---|---|---|
| 6A | — | 1194 | 1223 |
| 6B | Carrageenan | 96 | 180 |
| 6C | Xanthan gum | 37 | 1068 |
| 6D | Carboxymethylcellulose | 172 | 900 |

As shown in Table 6, the addition of anionic dishing reducing polymer is effective in controlling oxide dishing, particularly on small features. Sample 6A included no dishing reducing agent, whereas samples 6B, 6C & 6D included three different types of dishing reducing agents. As can be seen from Table 6, the silicon oxide dishing values on both 5 μm and 20 μm features are much less for samples 6B, 6C and 6D when compared to sample 6A.

Example 7: Demonstration of Concentrates

In this example, polishing compositions used in samples 7A-7C included concentrates corresponding to a point of use formulation of: 3 w/w % neutral colloidal silica abrasive, an organic acid and/or potassium hydroxide as a pH adjuster, n-octadecylphosphonic acid, and water as a liquid carrier. The single pot solution contained all the components needed to polish, while the two-part system contained all components except for the organic acid. Mean particle size (MPS) is a reliable indicator of slurry stability. In unstable systems, particles agglomerated over time, causing measurable MPS growth. MPS was measured on a Malvern tool using dynamic light scatter technique. Slurries were stored in an oven set to 60° C. and measured every 7 days. As per the Arrhenius relationship for accelerated aging tests, the full test run of 21 days corresponds to roughly one year of room temperature aging. In other words, if the slurry is kept at 60° C. for 21 days and the MPS of the silica does not grow appreciably, it can be certified that the slurry has a real time shelf-life/expiration date of one year.

TABLE 7

Accelerated aging (60° C.) of slurry concentrates

| Sample | Type | pH | MPS [nm] Day 0 | MPS [nm] Day 7 | MPS [nm] Day 14 | MPS [nm] Day 21 |
|---|---|---|---|---|---|---|
| 7A | 2x single pot | 2.2 | 68 | 69 | 69 | 69 |
| 7B | 2x single pot | 3.0 | 65 | 65 | 66 | 66 |
| 7C | 5x two-part | 9.5 | 72 | 73 | 73 | 74 |

As shown in Table 7, all formulations are stable through the full test run. Stability in the acidic region for neutral silica is typically difficult to achieve. The single pot solutions were stable from pH of about 2 to about 6.5 at a 2× concentration (select data shown in Table 7) and at other concentration levels (e.g., 3×, 4×, and up to 10× concentrations) (not shown). In the two-part solution (7C), all components, with the exception of the acid, could be concentrated to a much greater degree and remained stable (up to 10× also remains stable). At point of use, the acid and water would be added to reconstitute the slurry before running it on a polishing tool.

Example 8: Demonstration of Patterned Wafer Removal Rate Selectivity

Figure 2:
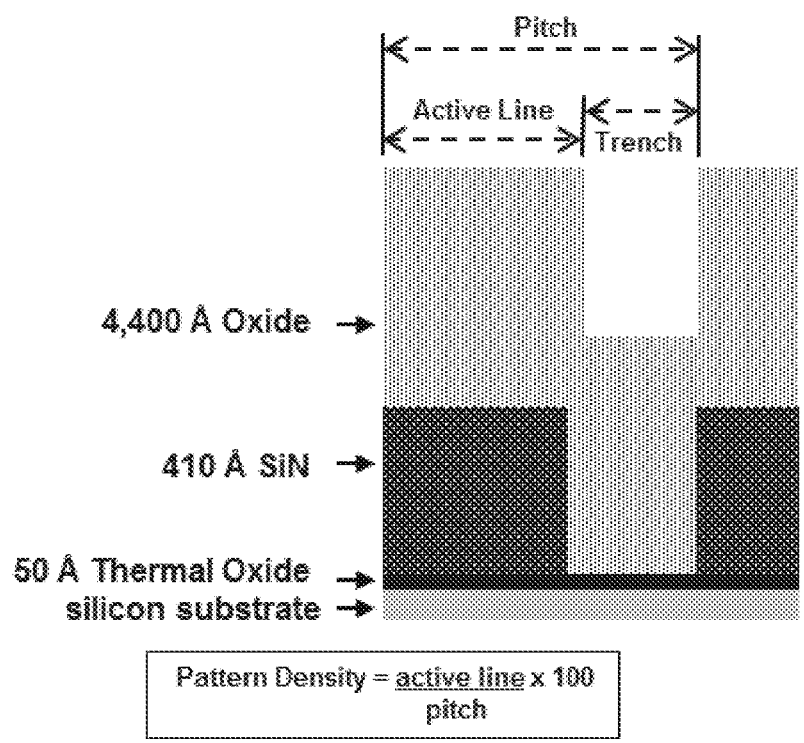
FIG. 2 is a schematic diagram of a STI patterned wafer film stack prior to polishing.

In this example, polishing compositions used in samples 8A, 8B, and 8C, which contained a colloidal silica abrasive and a nitride removal rate reducing agent shown in Tables 1, 3 and 5, were used to polish 200 mm STI patterned wafers wherein patterned silicon nitride is filled with high density silicon oxide as shown in FIG. 2. The pattern in the silicon nitride was such that a wide array of line space, square, checker, and mesh arrays of varying pitch and densities were arranged across the entire wafer face.

Polishing occurred on an Applied Materials 200 mm Mirra polishing tool, which was equipped with a DowDupont VP6000 pad, 3M A165 CIP1 conditioning disk, and employing a 2 PSI wafer back pressure. Polishing times were varied based upon in-situ endpoint detection by both motor torque and red laser (650 nm) absorbance. During polish, features within both of the endpoint signals can be observed indicating removal of silicon oxide in the active lines of the film stack and the exposure of the underlying silicon nitride. Patterned silicon oxide removal rate was calculated based upon the amount of material removed prior to the exposure of silicon nitride divided by polish time. Conversely, the patterned silicon nitride removal rates are calculated upon the amount of material removed divided by the time after it has been exposed to the polishing composition. Upon completion of the polishing, the wafers were cleaned via 200 mm OnTrack post CMP cleaning tool (from Lam Research company) using Fujifilm Wako 8901 post-CMP cleaning chemistry. Film thickness measurements (e.g., to determine removal rates) of all wafers were measured using a KLA Tencor F5X ellipsometer.

TABLE 8

Patterned wafer removal rates and selectivity on various line space arrays

| Sample | Array Active Line Width (µm) | Array Pitch (µm) | Array Pattern Density (%) | Silicon Oxide Removal Rate (Å/min) | Silicon Nitride Removal Rate (Å/min) | Selectivity |
|---|---|---|---|---|---|---|
| 8A | 5 | 50 | 10 | 1301 | 15 | 86.7 |
|  | 45 | 50 | 90 | 749 | 8 | 93.6 |
|  | 0.18 | 0.36 | 50 | 1330 | 7 | 190.0 |
|  | 0.50 | 1.00 | 50 | 1072 | 10 | 107.2 |
|  | 100 | 200 | 50 | 1920 | 18.0 | 106.6 |
| 8B | 100 | 200 | 50 | 1710 | 31.8 | 53.8 |
| 8C | 0.05 | 0.5 | 10 | 1043 | 238 | 4.3 |

From the data presented in Table 8, the high selectivities between silicon oxide and silicon nitride material removal rates previously observed on blanket wafers are also observed on patterned wafers containing both silicon oxide (top) and silicon nitride (bottom). As can be seen in Table 8, for sample 8A, silicon oxide to silicon nitride selectivity varies from 86 all the way to 190 depending on pattern size, density and pitch. For sample 8B, silicon oxide to silicon nitride selectivity is 54 whereas for sample 8C, the selectivity is 4. Table 8 solely provides representative examples of performance on patterned wafers. In our in-house experiments selectivity ratios have been observed to vary from 3 (which is considered satisfactory for patterned wafers) all the way to about 1000 on patterned test wafers depending on film complexity. Moreover, the selectivities of the polishing compositions containing the nitride removal rate reducing agent presented herein exceed the selectivity of many legacy, industry standard, commercially available, ceria based, STI polishing compositions presented in prior art.

Example 9: Demonstration of Patterned Wafer Dishing and Erosion

In this example, patterned wafers similar to the ones used in example 8 were measured in a Park Systems AFM tool in order to quantify silicon oxide dishing/step-heights and silicon nitride erosion/loss at endpoint. Polishing compositions used in samples 9A and 9B contained a nitride removal rate reducing agent shown in Tables 1, 3 and 5, and were used to polish patterned wafers whose stack is depicted in FIG. 2. The silicon oxide dishing/step-height and silicon nitride erosion/loss results are shown in Table 9. Planarization efficiency (PE) is reported in percentage and is equal to the change in silicon oxide step height divided by the amount of oxide removed during polish then multiplied by one hundred (to convert to percentage).

TABLE 9

Patterned Wafer Dishing and Erosion

| Sample | Array Active Line Width (µm) | Array Pitch (µm) | Array Pattern Density (%) | Oxide Dishing (Å) | Silicon Nitride Erosion (Å) | Planarization Efficiency (%) |
|---|---|---|---|---|---|---|
| 9A | 5 | 50 | 10 | 40 | 74 | 46 |
|  | 45 | 50 | 90 | 157 | 10 | 38 |
|  | 0.18 | 0.36 | 50 | 48 | 70 | 14 |
|  | 0.50 | 1.00 | 50 | 35.6 | 60 | 17 |
|  | 100 | 200 | 50 | 245 | 30 | 74 |
| 9B | 100 | 200 | 50 | 375 | 34 | 72 |

As can be seen in Table 9, the silicon oxide dishing and the silicon nitride erosion are very small. Typically, for dishing and erosion, very low numbers are preferred. The dishing and erosion numbers are representative of the flatness of the final topography post CMP polishing of the patterned wafers. So, a low value (in Å) of these numbers is desirable as these numbers measure the separation in the peaks and valleys of the films on the wafers that contain multiple film types in a patterned wafer. The lower the number, the less separation that exists between the peaks and troughs, implying flatter the wafer surface, which is the overall goal of the CMP process step in semiconductor fabrication. Ideally, a zero dishing and erosion value is preferred (implying completely flat wafer surface). Conventionally, however, these numbers are generally in the hundreds or thousands of Å values' on actual device/product patterned wafers. Thus, the data shown in Table 9 indicate that the polishing compositions provide a unique/extraordinary performance in delivering very low dishing and erosion values and hence very good topography of patterned wafers. As can be seen in Table 9, the silicon oxide dishing can be as low as 35 Å and as high as 375 Å. The SiN erosion is much better than the dishing as the erosion numbers are as low as 30 Å and as high as 74 Å. Again, these are representative examples and we have seen these dishing and erosion numbers as high as 1000 Å and as low as 1 Å in our experiments, which are still satisfactory for the purpose of this invention and are acceptable to semiconductor manufacturers.

For planarization efficiency (PE), the higher the number, the better the result. Ideally, a PE of 100% is desired as that value means that the whole wafer has been planarized and is flat, i.e., there is no step height between the peaks and valleys. From the data in Table 9, it can be seen that the PE varies from a low value of 14% all the way to 74%. Thus, these polishing compositions give good planarization efficiency on patterned wafers.

Again, the data presented in table 9 show that the polishing compositions presented herein exceed the oxide dishing, silicon nitride erosion and planarization efficiency of state-of-the-art, commercially available, ceria based, STI polishing compositions.

Example 10: Demonstration of Patterned Wafer Defectivity after Polishing

In this example, defectivity of patterned wafers similar to the ones used in examples 8 and 9 was measured in a KLA-AIT XUV defect counter tool by using a commercial ceria based STI formulation and composition 8A described in Example 8 (which is a silica based polishing composition containing the nitride removal rate reducing agent). The wafer map for a wafer polished by using composition 8A is presented in FIG. 3. The wafer map for a wafer polished by using the commercial ceria-based STI polishing composition is presented FIG. 4.

Figure 3:
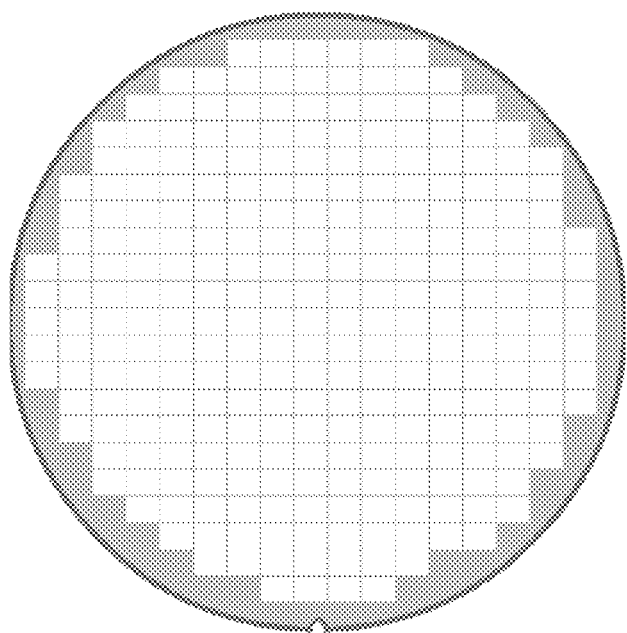
FIG. 3 is a wafer map depicting the overall defectivity after STI CMP using a silica based polishing composition according to the present disclosure.
Figure 4:
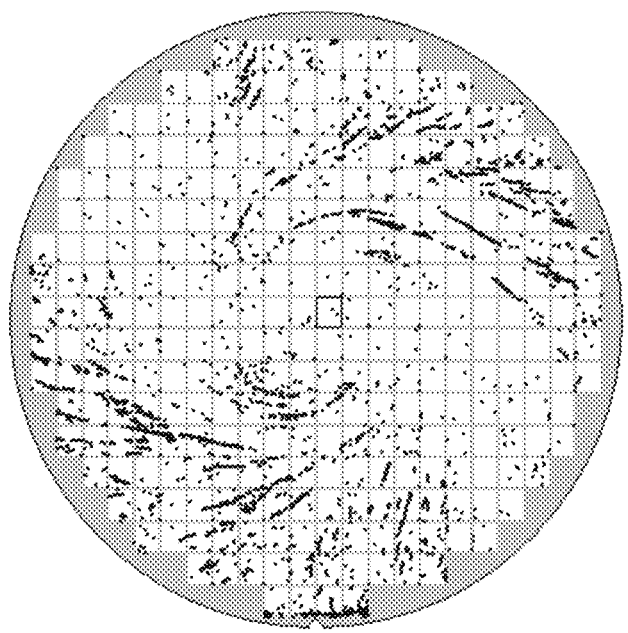
FIG. 4 is a wafer map depicting the overall defectivity after STI CMP using a commercial ceria abrasive containing composition.

As demonstrated by FIG. 4, the ceria-based formulation was prone to heavy arc scratching with many defects spread throughout the wafer (the total defect count was greater than 10,000)—due to the relative hardness and size of the abrasive. Closer inspection of the defects showed that there are lots of macro and micro scratches accompanied by many residues, many of which may be considered overall device killing defects. However, FIG. 3 shows that polishing composition 8A, containing high purity colloidal silica as the abrasive, has far less scratching than the ceria based composition (FIG. 4). Indeed, the silica polishing composition shows near-to "defect-free" and a clean surface. The total defect count is approximately 175 for defects at least 90 nm in size. Defects are key to final device yield, and the production of sellable chips. In the patterned wafer shown in FIG. 4, suppose there are 1000 dies (each square) per patterned wafer. Each of the dies that has a defect may turn out to not be sellable if the defect is a device killer defect. Thus, as the ceria-based polishing composition shows a high amount of defects, its yield of the sellable chips per wafer would be lower. Conversely, for the polishing compositions of this disclosure, the defects are significantly less and thus the yield of sellable chips per wafer is significantly higher.

Thus, the low defectivity obtained by using the polishing compositions of this disclosure is very attractive to semiconductor companies as that increases the top line and bottom line of their revenues. From a technical perspective, the ceria abrasives are inorganic in nature (e.g., cerium lanthanide metal based oxide) and are generally hard and larger in size than silica abrasives, so they are prone to give a large amount of scratching and defects on wafer surfaces. Conversely, the colloidal silica abrasives are organic in nature (silicon non-metal based oxide and in colloidal dispersion form) and are generally soft and therefore do not generate scratching or defects during polishing.

People skilled in the art have not been able to develop a silica based STI polishing composition with satisfactory removal selectivity of silicon oxide over silicon nitride. As disclosed herein, the present inventors have found a synergistic combination of silica and silicon nitride removal rate reducing agents that can supply to the industry, a silica based STI polishing composition. In addition, the invention described in this disclosure can be applied to abrasives other than silica (such as alumina, titania, etc.).

While this disclosure has been described with respect to the examples set forth herein, it is understood that other modifications and variations are possible without departing from the spirit and scope of the disclosure as defined in the appended claims.

The invention claimed is:

1. A polishing composition comprising:
   at least one abrasive in an amount of from at least about 0.05 wt % to at most about 20 wt % of the composition;
   at least one nitride removal rate reducing agent comprising a hydrophobic portion and a hydrophilic portion; wherein the hydrophobic portion comprises a $C_{16}$ to $C_{22}$ hydrocarbon group, the hydrophilic portion comprises at least one group selected from the group consisting of a sulfinite group, a sulfate group, a carboxylate group, a phosphate group, and a phosphonate group, the hydrophobic portion and the hydrophilic portion are separated by zero alkylene oxide group, and the at least one nitride removal rate reducing agent is in an amount of from at least about 0.1 ppm to at most about 1000 ppm of the composition;
   an acid or a base in an amount of from at least about 0.01 wt % to at most about 10 wt % of the composition; and
   water in an amount of from at least about 50 wt % to at most about 99.9 wt % of the composition;
   wherein the polishing composition is free of a salt and an anionic polymer, and the polishing composition has a pH of about 2 to about 6.5.

2. The polishing composition of claim 1, wherein the hydrophobic portion contains a $C_{16}$ to $C_{18}$ hydrocarbon group.

3. The polishing composition of claim 1, wherein the hydrophilic portion comprises a phosphate group or a phosphonate group.

4. The polishing composition of claim 1, wherein the nitride removal rate reducing agent is selected from the group consisting of stearyl phosphate, octadecylphosphonic acid, oleyl phosphate, behenyl phosphate, octadecyl sulfate, and combinations or mixtures thereof.

5. The polishing composition of claim 1, wherein the at least one abrasive is selected from the group consisting of alumina, silica, titania, ceria, zirconia, co-formed products thereof, coated abrasives, surface modified abrasives, and mixtures thereof.

6. The polishing composition of claim 1, wherein the at least one abrasive is selected from the group consisting of cationic abrasives, substantially neutral abrasives, and anionic abrasives.

7. The polishing composition of claim 1, wherein the abrasive is a silica-based abrasive.

8. The polishing composition of claim 2, wherein the polishing composition comprises at least two or at least three nitride removal rate reducing agents.

9. The polishing composition of claim 1, further comprising:
at least one dishing reducing agent;
wherein the at least one dishing reducing agent is a compound comprising at least one group selected from the group consisting of hydroxyl, sulfate, phosphonate, phosphate, sulfonate, amine, nitrate, nitrite, carboxylate, and carbonate groups.

10. The polishing composition of claim 1, wherein the polishing composition has a ratio of a removal rate for a silicon oxide to a removal rate for a silicon nitride of at least about 4:1 when polishing a patterned wafer comprising at least silicon nitride patterns overlayed with at least silicon oxide.

11. The polishing composition of claim 1, wherein the removal rate selectivity of silicon oxide to silicon nitride is at least about 5:1 and at most about 1000:1.

12. The polishing composition of claim 1, wherein the composition has a silicon oxide dishing of at most 1223 Å and at least about 0 Å.

13. The polishing composition of claim 1, wherein the composition has a silicon oxide dishing of at most about 375 Å.

14. The polishing composition of claim 1, wherein the composition has a silicon nitride erosion of at most 1000 Å and at least about 0 Å.

15. The polishing composition of claim 1, wherein the composition has a silicon nitride erosion of at most about 75 Å.

16. The polishing composition of claim 1, wherein the composition has a planarization efficiency of at least about 14% and at most about 100%.

17. The polishing composition of claim 1, wherein the composition has a planarization efficiency at least about 20% and at most about 99.9%.

18. The polishing composition of claim 1, wherein the composition forms at most a total of 5 defects on a patterned wafer having a diameter of about 300 mm when polishing the patterned wafer using the composition.

19. A method, comprising:
applying the polishing composition of claim 1 to a substrate having at least silicon nitride and at least silicon oxide on a surface of the substrate; and
bringing a pad into contact with the surface of the substrate and moving the pad in relation to the substrate.

20. The method of claim 19 wherein at least one of the silicon nitride and silicon oxide is doped with at least one dopant selected from the group consisting of carbon, nitrogen, oxygen, and hydrogen.

21. The method of claim 19, further comprising forming a semiconductor device from the substrate.

22. The method of claim 20, further comprising forming a semiconductor device from the substrate.

23. The polishing composition of claim 1, wherein
the at least one abrasive is in an amount of from at least about 1 wt % to at most about 6 wt % of the composition;
the at least one nitride removal rate reducing agent is in an amount of from at least about 5 ppm to at most about 500 ppm of the composition;
the acid or base is in an amount of from at least about 0.05 wt % to at most about 6 wt % of the composition; and
the water is in an amount of from at least about 50 wt % to at most about 97 wt % of the composition.

24. The polishing composition of claim 23, wherein the composition is free of an oxidizing agent.

\* \* \* \* \*